United States Patent
Asano (10) Patent No.: US 8,035,035 B2
(45) Date of Patent: Oct. 11, 2011

(54) MULTI-LAYER WIRING BOARD AND METHOD OF MANUFACTURING THE SAME

(75) Inventor: Toshiya Asano, Ichinomiya (JP)

(73) Assignee: NGK Spark Plug Co., Ltd., Nagoya-shi, Aichi (JP)

( * ) Notice: Subject to any disclaimer, the term of this patent is extended or adjusted under 35 U.S.C. 154(b) by 365 days.

(21) Appl. No.: 12/412,693

(22) Filed: Mar. 27, 2009

(65) Prior Publication Data

US 2009/0242245 A1  Oct. 1, 2009

(30) Foreign Application Priority Data

Mar. 28, 2008  (JP) ................................ P2008-086883

(51) Int. Cl.
*H05K 1/03* (2006.01)

(52) U.S. Cl. ........ 174/255; 174/259; 174/262; 361/767; 361/760

(58) Field of Classification Search .................. 174/250, 174/255–259, 260–266; 361/760, 679.01, 361/767, 748–750, 728–729; 29/830, 832, 29/839, 840, 846, 852

See application file for complete search history.

(56) References Cited

U.S. PATENT DOCUMENTS

| | | | | |
|---|---|---|---|---|
| 6,084,781 A | * | 7/2000 | Klein | 361/771 |
| 6,576,493 B1 | * | 6/2003 | Lin et al. | 438/107 |
| 6,988,312 B2 | | 1/2006 | Nakamura et al. | |
| 7,345,246 B2 | * | 3/2008 | Muramatsu et al. | 174/260 |
| 7,435,680 B2 | * | 10/2008 | Nakamura et al. | 438/678 |
| 2006/0272853 A1 | * | 12/2006 | Muramatsu et al. | 174/262 |
| 2007/0076392 A1 | * | 4/2007 | Urashima et al. | 361/763 |

* cited by examiner

*Primary Examiner* — Hoa C Nguyen
(74) *Attorney, Agent, or Firm* — Stites & Harbison PLLC; Jeffrey A. Haeberlin (57) ABSTRACT

A multi-layer wiring board without a core substrate includes: a multi-layer laminated structure; first terminals provided on a front surface of the multi-layer laminated structure; second terminals provided on a rear surface of the multi-layer laminated structure; a solder resist which covers the rear surface and which has solder resist openings formed at positions corresponding to the second terminals; a reinforcing plate which is made of a non-metal material and which has reinforcing plate openings formed at positions corresponding to the second terminals; and an adhesive layer interposed between the solder resist and the reinforcing plate to fix the reinforcing plate to the solder resist and which includes adhesive layer openings formed at positions corresponding to the second terminals. A diameter of the solder resist openings and a diameter of the reinforcing plate openings are smaller than that of the adhesive layer openings.

7 Claims, 6 Drawing Sheets

MULTI-LAYER WIRING BOARD AND METHOD OF MANUFACTURING THE SAME

CROSS-REFERENCE TO RELATED APPLICATIONS

This application claims priority from Japanese Patent Application No. 2008-086883, filed on Mar. 28, 2008, the entire contents of which are hereby incorporated by reference. This application is also related to application Ser. No. 12/412,748, filed on Mar. 27, 2009.

BACKGROUND OF THE INVENTION

1. Technical Field

Devices or methods consistent with the present disclosure relate to a multi-layer wiring board that does not include a core substrate.

2. Related Art

In recent years, the process speed of a semiconductor integrated circuit device (IC chip) used as, for example, a microprocessor of a computer has increased, and the functions thereof have been improved. As a result, the number of terminals tends to increase, and the pitch between the terminals tends to be narrowed. In general, a plurality of terminals are densely arranged in an array on the bottom of an IC chip, and the terminal group is connected to terminal group on a mother board by flip-chip bonding. However, there is a large difference between the pitch between the terminals in the terminal group of the IC chip and the pitch between the terminals in the terminal group of the mother board, and thus it is difficult to directly connect the IC chip to the mother board. Accordingly, in general, a package is used for mounting a wiring board for mounting the IC chip, and the package is mounted on the mother board.

As a wiring board for mounting the IC chip, a multi-layer wiring board is practically used that includes build-up layers formed on the front and rear surfaces of a core substrate. In the multi-layer wiring board, for example, a resin substrate (for example, a glass epoxy substrate) formed by impregnating a resin with a reinforcing fiber is used as the core substrate. A plurality of insulating layers and conductor layers are alternately formed on the front surface and the rear surface of the core substrate using the rigidity of the core substrate, and thus the build-up layers are formed. That is, in the multi-layer wiring board, the core substrate serves as a reinforcing member, and has a thickness that is considerably larger than that of the build-up layer. In addition, wiring lines (e.g., through-hole conductors) for electrically connecting each of layers in the build-up layers formed on the front surface and the rear surface are formed on the core substrate so as to pass through the core substrate.

Further, in recent years, with an increase in the process speed of a semiconductor integrated circuit device, signals in a high frequency band have been used. In this case, the wiring lines passing through the core substrate serve as large inductance, and thus the transmission loss of high-frequency signals or the malfunction of a circuit occurs, which makes it difficult to improve the process speed. In order to address this problem, a coreless wiring board without a core substrate has been proposed as the wiring board for mounting the IC chip (e.g., see Japanese Patent No. 3664720). Since the coreless wiring board does not include the core substrate having a relatively large thickness, the overall length of wiring lines is shortened. Therefore, it is possible to reduce the transmission loss of high-frequency signals and operate a semiconductor integrated circuit device at a high speed.

Also, since the coreless wiring board is manufactured without a core substrate, it is difficult to sufficiently ensure the strength of the coreless wiring board. Accordingly, in the related art, a frame is bonded to a device mounting surface for mounting an IC chip to reinforce the strength, thereby ensuring the strength of the coreless wiring board. The frame is provided at the edge of the substrate so as to surround the IC chip. In addition, Japanese Patent No. 3664720 describes that a metal plate subjected to an insulating process is adhered and fixed to a rear surface opposite to the device mounting surface, and then the coreless wiring board is interposed between the frame and the metal plate to ensure the strength of the wiring board, thereby preventing bending of the wiring board. In the coreless wiring board, a plurality of through-holes for exposing external connection terminal pads are formed in a metal reinforcing plate provided on the rear surface.

However, according to the coreless wiring board in Japanese Patent No. 3664720, conductor patterns such as the external connection terminal pads are formed on an outermost layer of a resin insulating layer by an adhesive, and the metal reinforcing plate is bonded to the resin insulating layer. Therefore, it is necessary to use an adhesive having good adhesion to metal of the conductor patterns or resin of the resin insulating layer in order to bond the metal reinforcing plate. When a general-purpose adhesive having a relatively low material cost, such as an adhesive only for resin that is used to adhere each resin, is used, it is difficult to obtain sufficient bonding strength. In addition, the metal reinforcing plate has lower workability and higher material costs than a resin plate. Even when a resin reinforcing plate is used instead of the metal plate, it is necessary to fix the reinforcing plate to the resin insulating layer having the conductor pattern formed thereon. Therefore, it is difficult to obtain sufficient adhesion strength.

Furthermore, in the coreless wiring board in Japanese Patent No. 3664720, after the metal reinforcing plate is bonded, solder bumps are formed on the external connection terminal pads through through-holes formed in the metal plate. That is, the metal reinforcing plate serves as a solder resist. Therefore, no solder resist is formed on the wiring board in Japanese Patent No. 3664720. However, the metal reinforcing plate is bonded to the wiring board by an adhesive, unlike the solder resist. Therefore, there is a concern that the adhesive may be melted by heat applied when the solder bumps are formed, flow into the through-holes, and be mixed as impurities with the solder bumps.

SUMMARY OF THE INVENTION

Exemplary embodiments of the present invention address the above disadvantages and other disadvantages not described above. However, the present invention is not required to overcome the disadvantages described above, and thus, an exemplary embodiment of the present invention may not overcome any of the problems described above.

Accordingly, it is an aspect of the present invention to provide a multi-layer wiring board capable of improving the strength of a substrate with a low manufacturing cost and a method of manufacturing the same.

According to one or more aspects of the present invention, there is provided a multi-layer wiring board without a core substrate. The multi-layer wiring board comprises: a multi-layer laminated structure which is formed by alternately laminating a plurality of wiring layers and a plurality of insulating layers; a plurality of first terminals which are provided on a front surface of the multi-layer laminated structure and on which a semiconductor integrated circuit device is to be mounted; a plurality of second terminals which are provided on a rear surface of the multi-layer laminated structure opposite to the front surface and which are to be electrically connected to another board; a solder resist which is formed to cover the rear surface and which comprises a plurality of solder resist openings formed at positions corresponding to positions of the second terminals; a reinforcing plate which is made of a non-metal material and which comprises a plurality of reinforcing plate openings formed at positions corresponding to the positions of the second terminals; and an adhesive layer which is interposed between the solder resist and the reinforcing plate to fix the reinforcing plate to the solder resist in a surface contact state and which comprises a plurality of adhesive layer openings formed at positions corresponding to the position of the second terminals. A diameter of the solder resist openings and a diameter of the reinforcing plate openings are smaller than that of the adhesive layer openings.

According to the multi-layer wiring board, since the reinforcing plate made of a non-metal material is fixed to the solder resist in a surface contact state, it is possible to obtain sufficient adhesion strength, as compared to the related art in which a metal reinforcing plate is fixed to the upper surface of a resin insulating layer having a conductor pattern formed thereon. In addition, since the reinforcing plate is made of a non-metal material, it has high workability. Therefore, it is possible to easily form the reinforcing plate openings at positions corresponding to the second terminals, and it is also possible to reduce a material cost. Further, since the diameter of the reinforcing plate openings and the diameter of the solder resist openings are smaller than that of the adhesive layer opening, it is possible to firmly fix the reinforcing plate without the adhesive layer protruding toward the inside of the solder resist opening or the inside of the reinforcing plate opening. Therefore, when the solder bumps are provided on the second terminals and the multi-layer wiring board is mounted on an external substrate through the solder bumps, it is possible to prevent the melted solder bumps from being contacted with the adhesive layer. As a result, it is possible to prevent an adhesive from being mixed with the solder bumps.

The diameter of the reinforcing plate openings may be smaller than that of the solder resist opening. According to this structure, since the diameter of the reinforcing plate openings is reduced, it is possible to ensure the rigidity of the reinforcing plate and a sufficient reinforcement area by the reinforcing plate. In addition, it is possible to minimize a region in which mismatching between coefficients of thermal expansion (CTE) occurs, in the rear surface of the multi-layer wiring board. As a result, it is possible to improve the reliability of a multi-layer wiring board.

The reinforcing plate may be mainly formed of a synthetic resin, and the adhesive layer may be formed of a hardened material of a thermosetting resin. According to this structure, since the solder resist is formed of a resin material having high heat resistance, the reinforcing plate made of a synthetic resin can be firmly adhered and fixed to the solder resist made of a resin material.

Solder bumps or terminal pins may be provided on a corresponding one of the second terminals. The solder bumps or the terminal pins electrically connect the second terminals to the another substrate.

A metal material forming the solder bumps may be selected in accordance with a material forming the connection terminals of a mounted electronic component. For example, any of the following materials may be used as the metal material forming the solder bumps: Pb—Sn-based solder, such as 90Pb-10Sn, 95Pb-5Sn, or 40Pb-60Sn; Sn—Sb-based solder; Sn—Ag-based solder; Sn—Ag—Cu-based solder; Au—Ge-based solder; and Au—Sn-based solder.

In addition, a lead terminal made of, for example, a Cu alloy or an iron-nickel-cobalt alloy may be used as the terminal pin. The terminal pin may be fixed to the second terminal by soldering, for example.

It is advantageous that the diameter of the solder resist openings is smaller than that of the adhesive layer openings by 50 μm or more. According to this structure, it is possible to firmly fix the reinforcing plate without the adhesive layer protruding toward the inside of the solder resist opening or the inside of the reinforcing plate opening. From the same reason, it is advantageous that the diameter of the reinforcing plate openings is smaller than that of the adhesive layer openings by 50 μm or more.

The diameter of the reinforcing plate openings may be reduced from a non-adhered surface to an adhered surface of the reinforcing plate. According to this structure, it is possible to ensure a sufficient adhesion area of the reinforcing plate to the rear surface of the substrate, and improve the rigidity of the multi-layer wiring board. In addition, it is possible to reduce a region in which mismatching between coefficients of thermal expansion (CTE) occurs, in the rear surface of the multi-layer wiring board, by increasing the area reinforced by the reinforcing plate. As a result, it is possible to improve the reliability of the multi-layer wiring board.

Solder balls may be bonded to the second terminals and the maximum value of the diameter of the reinforcing plate openings may be larger than that of the solder ball. In addition, the minimum value of the diameter of the reinforcing plate openings may be set to be smaller than that of the solder ball. According to this structure, the solder balls can be reliably bonded to the second terminals through the reinforcing plate openings, and thus it is possible to ensure a sufficient adhesion area of the reinforcing plate.

Examples of the multi-layer wiring substrate without a core according to the aspects of the present invention include a "multi-layer wiring substrate mainly having interlayer insulating layers of a same configuration" and a "multi-layer wiring substrate in which conductor layers are connected to each other by only via holes having diameters extending in the same direction."

The insulating layer may be selected in light of, for example, an insulating property, heat resistance, and humidity resistance. The insulating layer may be formed of any of the following materials: thermosetting resins, such as epoxy resin, phenol resin, urethane resin, silicon resin, and polyimide resin; and thermoplastic resins, such as polycarbonate resin, acrylic resin, polyacetal resin, and polypropylene resin. Among the resin materials, for example, a composite material of the resin and inorganic fiber such as glass fiber (glass woven fabric or glass nonwoven fabric), a composite material of the resin and organic fiber such as polyamide fiber, or a resin-resin composite material obtained by impregnating a three-dimensional net-shaped fluorine-based resin base, such as expanded PTFE, with thermosetting resin, such as epoxy resin, may be used.

The wiring layers are patterned on the insulating layers by a subtractive method, a semi-additive method, or a full additive method, for example. For example, the conductor layer may be formed of a metal material, such as copper, copper alloy, nickel, nickel alloy, tin, or tin alloy.

According to one or more aspects of the present invention, there is provided a method of manufacturing a multi-layer wiring board. the method comprises: (a) providing a multi-layer laminated structure which is formed by alternately laminating a plurality of wiring layers and a plurality of insulating layers, wherein a plurality of first terminals are provided on a front surface of the multi-layer laminated structure, and a plurality of second terminals are provided on a rear surface of the multi-layer laminated structure opposite to the front surface; (b) forming a solder resist to cover the rear surface of the multi-layer laminated structure; (c) forming a plurality of solder resist openings in the solder resist such that the solder resist openings are formed at positions corresponding to positions of the second terminals; (d) providing a reinforcing plate which is made of a non-metal material and has a plurality of reinforcing plate openings formed therein, wherein an adhesive layer in non-hardened state is provided on one surface of the reinforcing plate, and the adhesive layer has a plurality of adhesive layer openings formed at positions corresponding to the positions of the reinforcing plate openings, and wherein a diameter of the solder resist openings and a diameter of the reinforcing plate openings are set to be smaller than that of the adhesive layer openings; (e) fixing the reinforcing plate to the solder resist in a surface contact state using the adhesive layer, such that each of the reinforcing plate openings is opposed to a corresponding one of the solder resist openings; and (f) hardening the adhesive layer in the non-hardened state at a temperature that is lower than a solder melting temperature.

According to the above method, since the reinforcing plate made of a non-metal material is fixed to the solder resist in a surface contact state, it is possible to obtain sufficient adhesion strength, as compared to the related art in which a metal reinforcing plate is fixed to the upper surface of a resin insulating layer having a conductor pattern formed thereon. In addition, since the reinforcing plate in step (d) is made of a non-metal material, it has high workability. Therefore, it is possible to easily form the reinforcing plate openings at positions corresponding to the second terminals, and it is also possible to reduce a material cost. Further, since the diameter of the reinforcing plate openings and the diameter of the solder resist openings are set to be smaller than that of the adhesive layer openings, it is possible to firmly fix the reinforcing plate without the adhesive layer protruding toward the inside of the solder resist opening or the inside of the reinforcing plate opening. Therefore, when the solder bumps are provided on the second terminals and the multi-layer wiring board is mounted on another substrate through the solder bumps, it is possible to prevent the melted solder bumps from being contacted with the adhesive layer. As a result, it is possible to prevent an adhesive from being mixed with the solder bumps.

When the solder bumps or the terminal pins are provided on the second terminals, a step of providing the solder bumps or the terminal pins may be performed before the reinforcing plate adhering step. When the step of providing the solder bumps or the terminal pins is performed after the reinforcing plate adhering step, the thermal stress of soldering in the step of providing the solder bumps or the terminal pins is applied to the reinforcing plate or the adhesive layer. In contrast, when the step of providing the solder bumps or the terminal pins is performed before the reinforcing plate adhering step, it is possible to prevent the thermal stress of soldering from being applied. In addition, when the reinforcing plate or the adhesive layer is made of a material having high heat resistance, the step of providing the solder bumps or the terminal pins may be performed after the reinforcing plate adhering step.

The adhesive layer is temporarily adhered to one surface of the reinforcing plate in step (d), and then adhered to the solder resist in step (e). Inversely, when the adhesive layer is temporarily adhered to the solder resist and then adhered to the reinforcing plate, the solder bumps or the terminal pins on the second terminals make it difficult to temporarily adhere the adhesive layer. In contrast, since uneven portions, such as the solder bumps or the terminal pins, are not provided in the reinforcing plate, it is possible to easily perform the temporary adhesion of the adhesive layer to one surface of the reinforcing plate in step (d). Further, in step (f), the adhesive layer in a non-hardened state is hardened at a temperature that is lower than a solder melting temperature. Therefore, it is possible to prevent the solder bumps on the second terminals or solder bonding portions that bond the terminal pins to the second terminals from being melted.

Other aspects, features and advantages of the invention will be apparent from the following description, the drawings and the claims.

DETAILED DESCRIPTION OF EXEMPLARY EMBODIMENTS OF THE INVENTION

Exemplary embodiments of the present invention will be described with reference to the drawings hereinafter.

Figure 1:
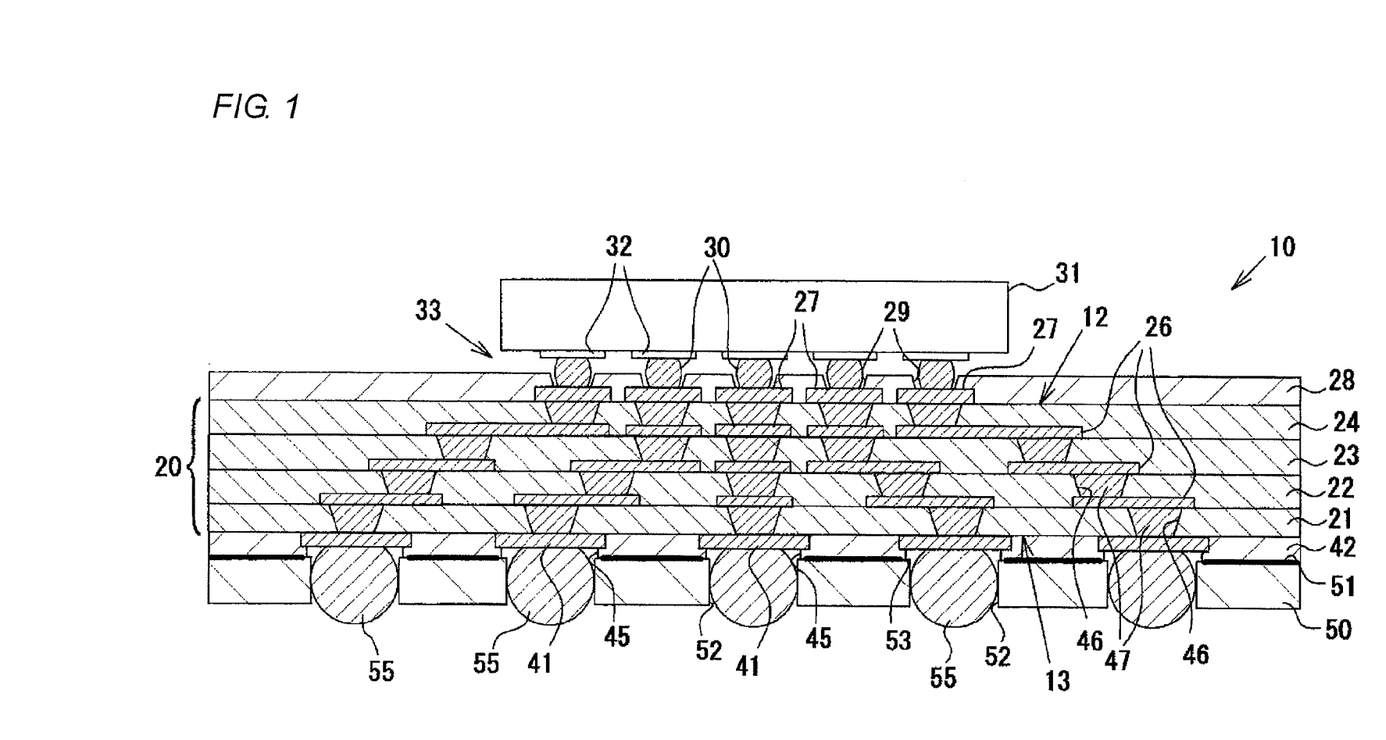
FIG. 1 is a cross-sectional schematic view illustrating the structure of a coreless wiring board according to an exemplary embodiment of the present invention.

FIG. 1 is a cross-sectional schematic view illustrating the structure of a coreless wiring board (multi-layer wiring board) according to the exemplary embodiment.

As shown in FIG. 1, a coreless wiring board 10 does not include a core substrate, and includes a multi-layer laminated structure obtained by alternately forming four resin insulating layers (interlayer insulating layers) 21, 22, 23, and 24 made of epoxy resin and conductor layers 26 made of copper. The resin insulating layers 21 to 24 are interlayer insulating layers that have the same thickness and are made of the same material, and are formed of a sheet-shaped build-up material made of epoxy resin.

Terminal pads 27 (connection terminals on front surface side) are arranged in an array on a front surface 12 of the coreless wiring board 10 (the front surface of the fourth resin insulating layer 24). In addition, a solder resist 28 covers substantially the entire front surface of the resin insulating layer 24. Openings 29 that expose the terminal pads 27 are formed in the solder resist 28. A plurality of solder bumps 30 are provided on the surfaces of the terminal pads 27. Each of the solder bumps 30 is electrically connected to a corresponding one of surface connection terminals 32 of an IC chip 31 (semiconductor integrated circuit device) which is formed in a rectangular flat plate shape. The terminal pads 27 and the solder bumps 30 are formed in an IC chip mounting region 33 capable of mounting the IC chip 31.

Ball grid array (BGA) pads 41 (connection terminals on the rear surface side) are provided in an array on a rear surface 13 of the coreless wiring board 10 (the lower surface of the first resin insulating layer 21). In addition, a solder resist 42 covers substantially the entire lower surface of the resin insulating layer 21. Openings 45 (solder resist openings) that expose the BGA pads 41 are formed in the solder resist 42 at positions corresponding to the BGA pads 41. In addition, via holes 46 and via conductors 47 are formed in each of the resin insulating layers 21, 22, 23, and 24. The via hole 46 has an inverted truncated cone shape, for example, and is formed by holing each of the resin insulating layers 21 to 24 using a YAG laser or a carbon dioxide gas laser. The diameters of the via conductors 47 extend in the same direction (the upward direction in FIG. 1), and each of the via conductors 47 electrically connects the conductor layer 26, the terminal pad 27, and the BGA pad 41.

In the coreless wiring board 10 according to the exemplary embodiment, a reinforcing plate 50 is adhered and fixed to the solder resist 42 in a surface contact state by an adhesive layer 51. A plate that is made of a non-metal material and has a thickness of about 0.5 mm may be used as the reinforcing plate 50. For example, a glass epoxy substrate made of epoxy resin and glass fiber is used as the reinforcing plate. A plurality of openings 52 (reinforcing plate openings) are formed in the reinforcing plate 50 at positions corresponding to the plurality of BGA pads 41.

The adhesive layer 51 is a hardened material of a thermosetting resin having high heat resistance. For example, the adhesive layer 51 is formed by hardening a film-shaped adhesive sheet made of an epoxy resin. A plurality of openings 53 (adhesive openings) are formed in the adhesive layer 51 at positions corresponding to the plurality of BGA pads 41.

In the exemplary embodiment, the plurality of BGA pads 41 are formed in circular shapes in a plan view, and the openings 45, 52, and 53 respectively formed in the solder resist 42, the reinforcing plate 50, and the adhesive layer 51 have circular shapes in a plan view.

Figure 2:
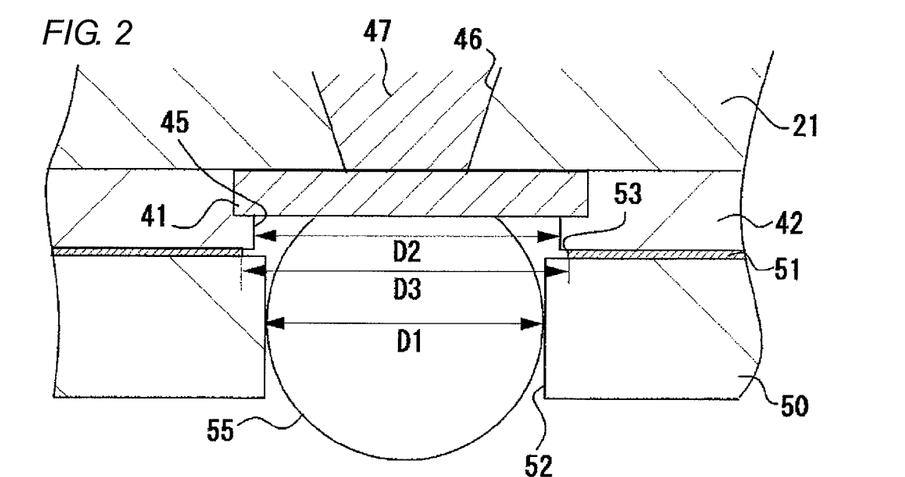
FIG. 2 is an enlarged cross-sectional view illustrating a main part of the coreless wiring board according to the exemplary embodiment.

As shown in FIG. 2, in the coreless wiring board 10 according to the exemplary embodiment, the diameter D1 of the opening 52 of the reinforcing plate 50 and the diameter D2 of the opening 45 of the solder resist 42 are set to be smaller than the diameter D3 of the opening 53 of the adhesive layer 51. In addition, the diameter D1 of the opening 52 of the reinforcing plate 50 is set to be smaller than the diameter D2 of the opening 45 of the solder resist 42. That is, the openings 45, 52, and 53 are formed such that the diameter D1 of the opening 52 of the reinforcing plate 50 is the smallest, followed by the diameter D2 of the opening 45 of the solder resist 42 and the diameter D3 of the opening 53 of the adhesive layer 51.

In addition, solder bumps 55 are provided on the front surfaces of the BGA pads 41 through the openings 45, 52, and 53, and the coreless wiring board 10 shown in FIG. 1 is mounted on a mother board (not shown) by the solder bumps 55.

For example, the coreless wiring board 10 having the above-mentioned structure is manufactured as follows.

In the exemplary embodiment, a supporting substrate (for example, a glass epoxy substrate) having sufficient strength is prepared, and the resin insulating layers 21 to 24 and the conductor layers 26 of the coreless wiring board 10 are built up on the supporting substrate. FIGS. 3 to 13 are diagrams illustrating the manufacturing method, and show, for example, the resin insulating layers 21 to 24 and the conductor layers 26 formed on the upper surface of the supporting substrate. Although not shown in the drawings, the resin insulating layers 21 to 24 and the conductor layers 26 are similarly formed on the lower surface of the supporting substrate.

Figure 3:
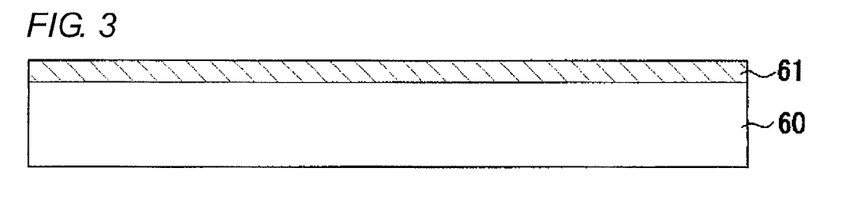
FIG. 3 is a diagram illustrating a method of manufacturing the coreless wiring board according to the exemplary embodiment.
Figure 4:
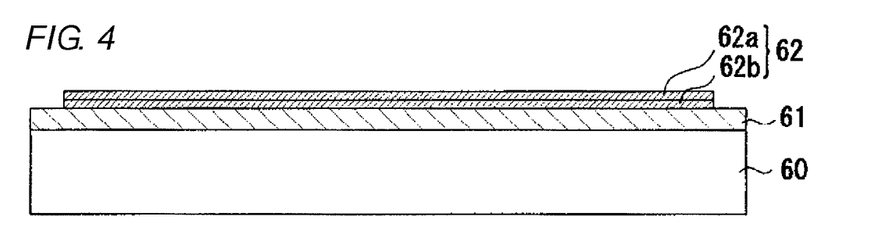
FIG. 4 is a diagram illustrating the method of manufacturing the coreless wiring board according to the exemplary embodiment.

Specifically, as shown in FIG. 3, a sheet-shaped insulating resin base made of epoxy resin is adhered onto the upper surface of a supporting substrate 60 in a partially hardened state so as to form an underlying resin insulating layer 61. Then, as shown in FIG. 4, a laminated metal sheet 62 is provided on the upper surface of the underlying resin insulating layer 61. Since the laminated metal sheet 62 is provided on the underlying resin insulating layer 61 in a partially hardened state, it possible to ensure sufficient adhesion to prevent the laminated metal sheet 62 from being peeled off from the underlying resin insulating layer 61 in the subsequent manufacturing process. The laminated metal sheet 62 is formed by closely adhering two copper foils 62a and 62b such that they can be peeled off from each other. Specifically, metal plating (for example, chrome plating) is performed to laminate the two copper foils 62a and 62b, thereby forming the laminated metal sheet 62.

Figure 5:
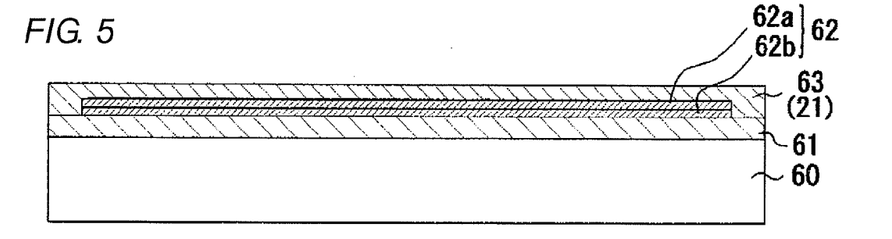
FIG. 5 is a diagram illustrating the method of manufacturing the coreless wiring board according to the exemplary embodiment.

Then, as shown in FIG. 5, the sheet-shaped insulating resin base 63 is arranged so as to cover the laminated metal sheet 62, and a vacuum heat press machine (not shown) is used to press and heat the sheet-shaped insulating resin base 63 in a vacuum atmosphere, thereby hardening the insulating resin base 63. Thus, the first resin insulating layer 21 is formed. The resin insulating layer 21 is closely adhered to the laminated metal sheet 62, and is also closely adhered to the underlying resin insulating layer 61 in a peripheral region of the laminated metal sheet 62 to seal the laminated metal sheet 62.

Figure 6:
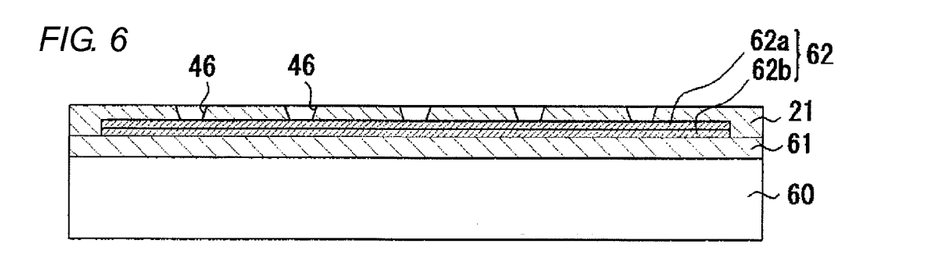
FIG. 6 is a diagram illustrating the method of manufacturing the coreless wiring board according to the exemplary embodiment.
Figure 7:
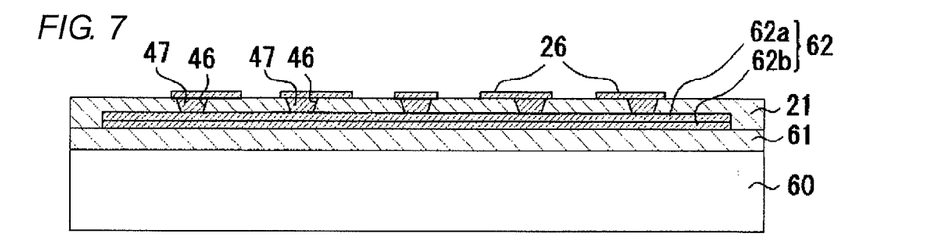
FIG. 7 is a diagram illustrating the method of manufacturing the coreless wiring board according to the exemplary embodiment.

Then, as shown in FIG. 6, a laser is used to form the via holes 46 in the resin insulating layer 21 at given positions, and then a desmear process of removing smears in the via holes 46 is performed. Then, electroless copper plating and electrolytic copper plating are performed to form the via conductor 47 in each of the via holes 46 and to form the conductor layer 26 on the resin insulating layer 21. In addition, etching is performed by, for example, a semi-additive method to pattern the conductor layer 26 on the resin insulating layer 21 (see FIG. 7).

The second to fourth resin insulating layers 22 to 24 and the conductor layers 26 are built up on the resin insulating layer 21 by the same method as the forming method of the first resin insulating layer 21 and the conductor layer 26. Then, a photosensitive epoxy resin is applied onto the resin insulating layer 24 having the terminal pads 27 formed thereon and then hardened to form the solder resist 28. Then, a certain mask is placed on the solder resist, and exposure and development are performed to pattern the solder resist 28, thereby forming the openings 29. Thus, a laminated body 70, which includes the laminated metal sheet 62, the resin insulating layers 21 to 24, and the conductor layers 26, is formed on the supporting substrate 60 (see FIG. 8). In the laminated body 70, a region (multi-layer) disposed on the laminated metal sheet 62 is a wiring laminated portion 20 (laminated structure) serving as the coreless wiring board 10.

Figure 8:
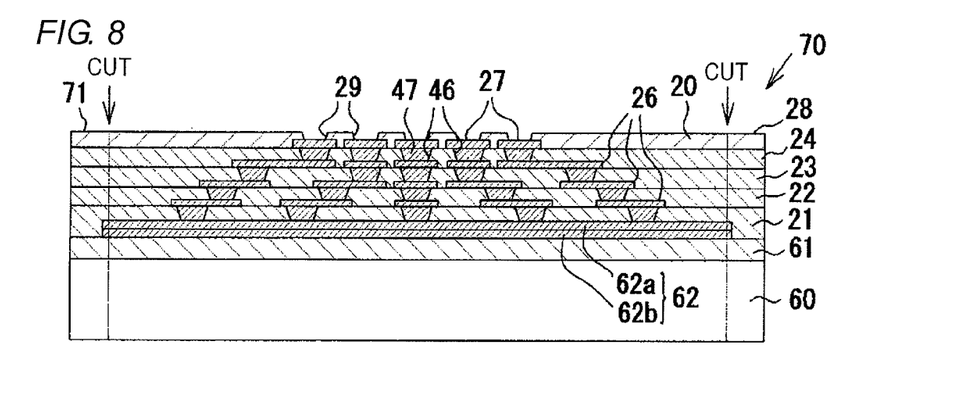
FIG. 8 is a diagram illustrating the method of manufacturing the coreless wiring board according to the exemplary embodiment.

A dicing machine (not shown) is used to cut the laminated body 70, thereby removing a peripheral region of the wiring laminated portion 20 of the laminated body 70. In this case, as shown in FIG. 8, the underlying resin insulating layer 61 and the supporting substrate 60 below the wiring laminated portion 20 are also cut at the boundary between the wiring laminated portion 20 and the peripheral portion 71 thereof. By this cutting process, the edge of the laminated metal sheet 62 sealed by the resin insulating layer 21 is exposed. That is, when the peripheral portion 71 is removed, a close contact portion between the underlying resin insulating layer 61 and the resin insulating layer 21 is also removed. As a result, the wiring laminated portion 20 and the supporting substrate 60 are connected to each other by only the laminated metal sheet 62.

Figure 9:
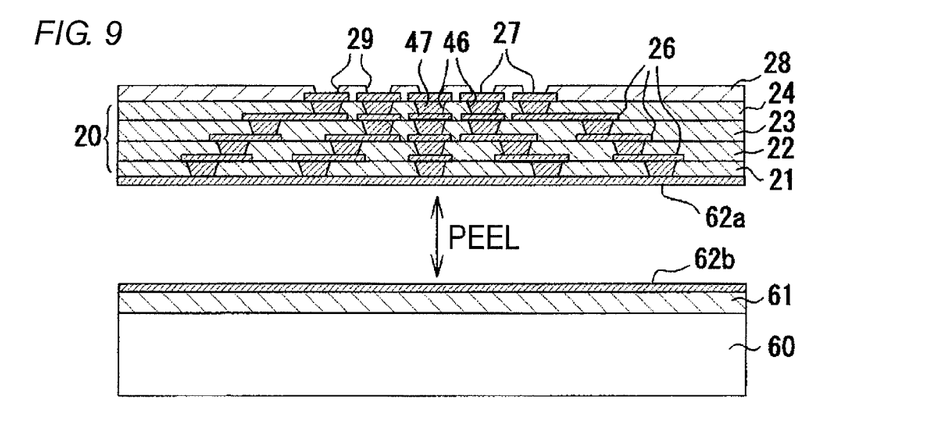
FIG. 9 is a diagram illustrating the method of manufacturing the coreless wiring board according to the exemplary embodiment.
Figure 10:
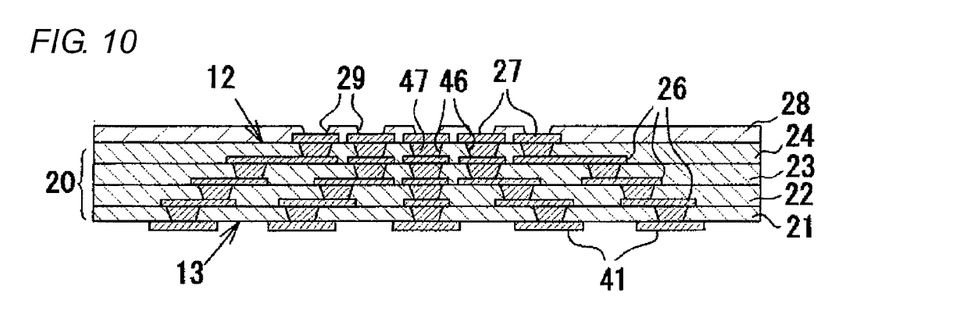
FIG. 10 is a diagram illustrating the method of manufacturing the coreless wiring board according to the exemplary embodiment.
Figure 11:
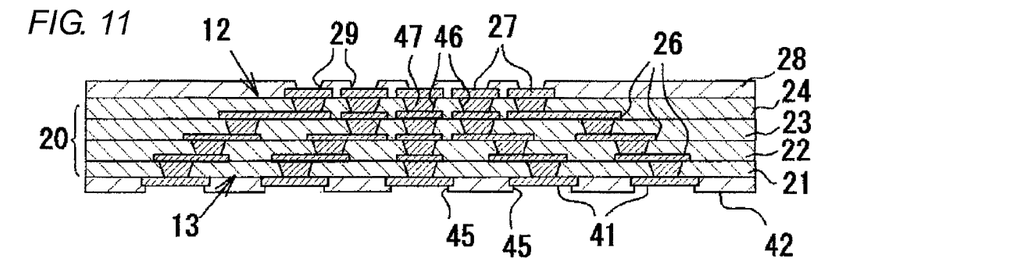
FIG. 11 is a diagram illustrating the method of manufacturing the coreless wiring board according to the exemplary embodiment.

As shown in FIG. 9, the wiring laminated portion 20 is separated from the supporting substrate 60 at the interface between the two copper foils 62a and 62b of the laminated metal sheet 62. Then, as shown in FIG. 10, the copper foil 62a on the rear surface 13 (the lower surface) of the wiring laminated portion 20 (resin insulating layer 21) is patterned by etching to form the BGA pads 41. Then, as shown in FIG. 11, a photosensitive epoxy resin is applied onto the resin insulating layer 21 having the BGA pads 41 formed thereon and then hardened, so that the solder resist 42 is formed to cover the rear surface 13 of the wiring laminated portion 20 (solder resist forming process). Then, a certain mask is placed on the solder resist 42, and exposure and development are performed to pattern the solder resist 42, thereby forming the openings 45.

Then, the solder bumps 30 are formed on the plurality of terminal pads 27 formed on the front surface 12 of the wiring laminated portion 20. Specifically, a solder ball mounting apparatus (not shown) is used to arrange the solder balls on the terminal pads 27, and the solder balls are heated at a given temperature to reflow. Thus, the solder bumps 30 are formed on the terminal pads 27. Similarly, the solder bumps 55 are formed on the plurality of BGA pads 41 formed on the rear surface 13 of the wiring laminated portion 20.

Figure 12:
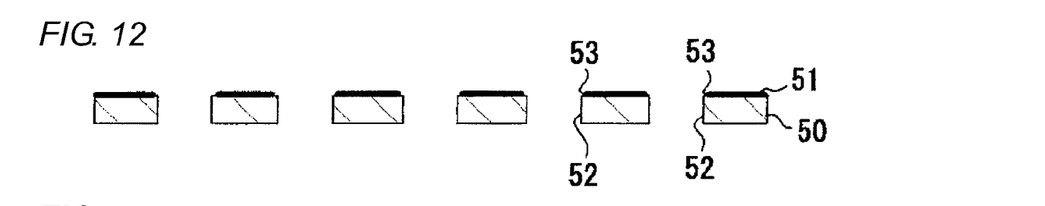
FIG. 12 is a diagram illustrating the method of manufacturing the coreless wiring board according to the exemplary embodiment.

Then, as shown in FIG. 12, the reinforcing plate 50 is prepared that has a plurality of openings 52 formed therein and the adhesive layer 51 in a non-hardened state formed on one surface thereof (reinforcing plate preparation process). For example, the openings 52 of the reinforcing plate 50 are formed by a drilling process using a drilling machine. In addition, for example, the openings 53 of the adhesive layer 51 are formed by punching a film-shaped adhesive sheet using a punching mold. Further, the openings 53 of the adhesive layer 51 are formed such that the diameter thereof is larger than that of the opening 52 of the reinforcing plate 50.

Figure 13:
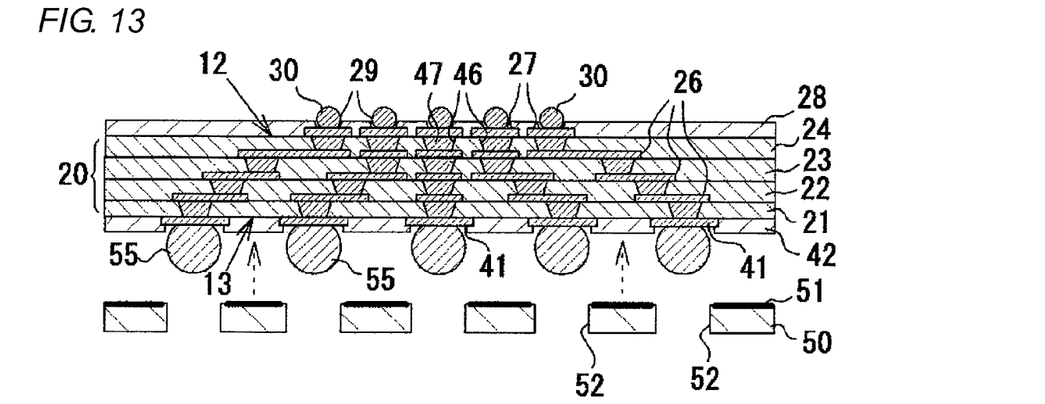
FIG. 13 is a diagram illustrating the method of manufacturing the coreless wiring board according to the exemplary embodiment.

Then, as shown in FIG. 13, the reinforcing plate 50 is fixed to the solder resist 42 in a surface contact state by the adhesive layer 51 (reinforcing plate adhering process). Then, heating is performed at a temperature (for example, 150° C.) that is lower than a solder melting temperature (for example, 210° C.) of the solder bump 55, and then the adhesive layer 51 is in a non-hardened state is hardened (hardening process). Thus, the coreless wiring board 10 shown in FIG. 1 is obtained.

Therefore, in the exemplary embodiment, the following effects can be obtained.

(1) In the coreless wiring board 10 according to the exemplary embodiment, the resin reinforcing plate 50, formed of a glass epoxy substrate, is adhered and fixed to the solder resist 42 in a surface contact state. Therefore, it is possible to obtain sufficient adhesion strength, as compared to the related art in which a metal reinforcing plate is adhered and fixed to the upper surface of a resin insulating layer having a conductor pattern formed thereon. In addition, since the reinforcing plate 50 is made of a resin material, it has high workability. Therefore, it is possible to easily form the openings 52 at positions corresponding to the BGA pads 41, and also it is possible to reduce a material cost. Furthermore, since the diameter D1 of the opening 52 of the reinforcing plate 50 and the diameter D2 of the opening 45 of the solder resist 42 are set to be smaller than the diameter D3 of the opening 53 of the adhesive layer 51, it is possible to firmly fix the reinforcing plate 50 without the adhesive layer 51 protruding toward the inside of the opening 45 of the solder resist 42 or the inside of the opening 52 of the reinforcing plate 50. Therefore, the solder bumps 55 on the BGA pads 41 do not contact the adhesive layer 51. As a result, when the coreless wiring board 10 is mounted on a mother board, it is possible to prevent an adhesive from being mixed with the melted solder bumps 55.

(2) In the coreless wiring board 10 according to the exemplary embodiment, a process of providing the solder bumps 55 on the BGA pads 41 is performed before a process of adhering the reinforcing plate 50. In the hardening process, the adhesive layer 51 in a non-hardened state is hardened at a temperature that is lower than the solder melting temperature. Therefore, it is possible to prevent the solder bumps 55 formed on the BGA pads 41 from being melted in the process of hardening the adhesive layer 51.

(3) In the coreless wiring board 10 according to the exemplary embodiment, the diameter D1 of the opening 52 of the reinforcing plate 50 is set to be smaller than the diameter D2 of the opening 45 of the solder resist 42. As such, since the diameter D1 of the opening 52 of the reinforcing plate 50 is reduced, it is possible to ensure the rigidity of the reinforcing plate 50 and a sufficient reinforcement area by the reinforcing plate 50. As a result, in a process of mounting the IC chip 31 on the coreless wiring board 10, it is possible to reliably position the coreless wiring board 10 without bending or damaging the coreless wiring board 10. In addition, it is possible to prevent a region in which mismatching between coefficients of thermal expansion (CTE) occurs from being formed in the rear surface 13 of the coreless wiring board 10. As a result, the reliability of the coreless wiring board 10 can be improved.

The exemplary embodiment of the present invention may be modified as follows.

Figure 14:
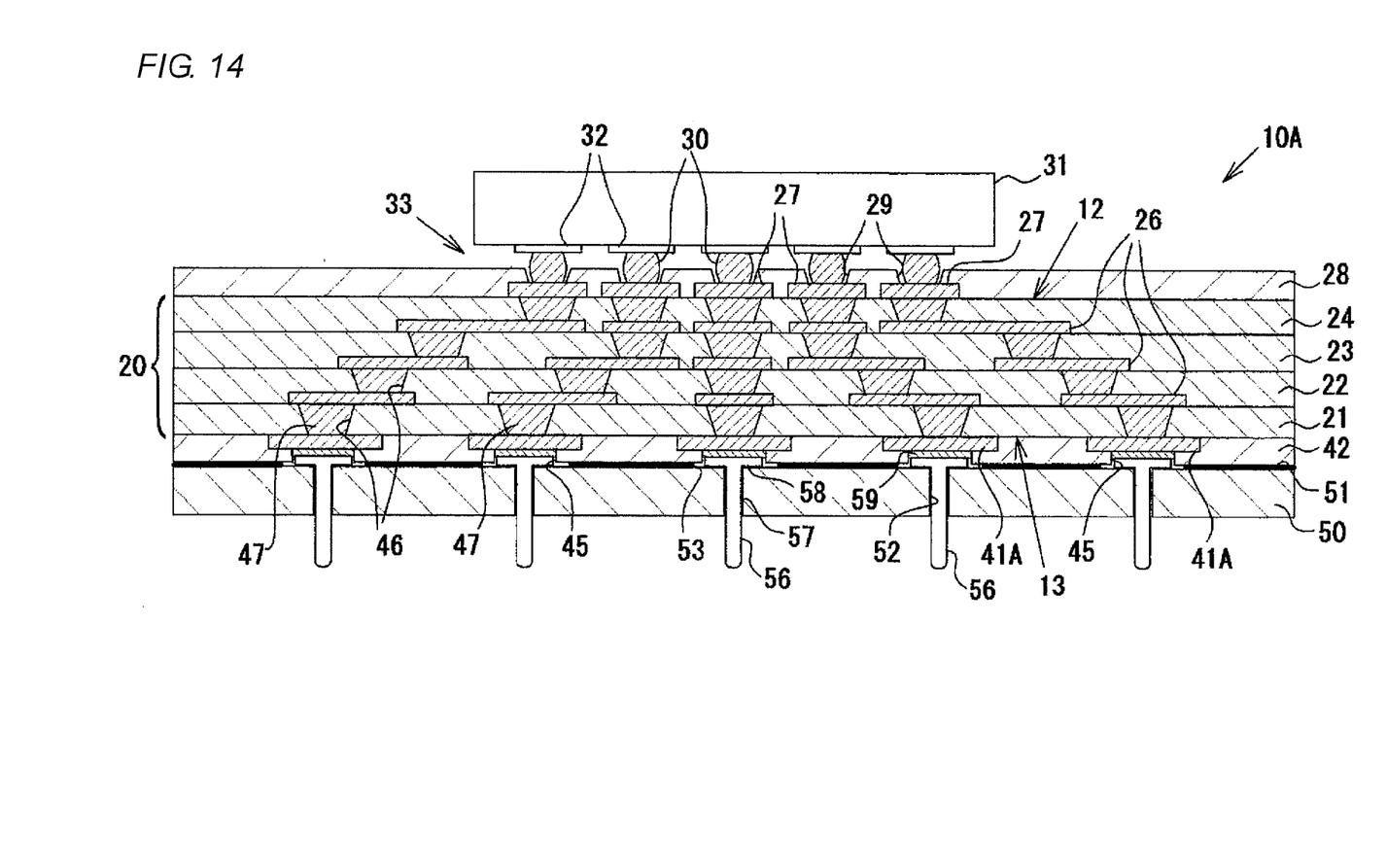
FIG. 14 is a cross-sectional schematic view illustrating the structure of a coreless wiring board according to another exemplary embodiment of the present invention.

In the above-described embodiment, the coreless wiring board 10 employs a ball grid array (BGA) package type, but it may employ a PGA (pin grid array) package type. FIG. 14 shows a coreless wiring board 10A. In the coreless wiring board 10A, PGA pads 41A (connection terminals on the rear surface side) are arranged in an array on the rear surface 13 (the lower surface of the first resin insulating layer 21), and terminal pins 56 are soldered to the PGA pads 41A. The coreless wiring board 10A has the same structure as the coreless wiring board 10 except that the terminal pins 56 are provided on the PGA pads 41A.

Figure 15:
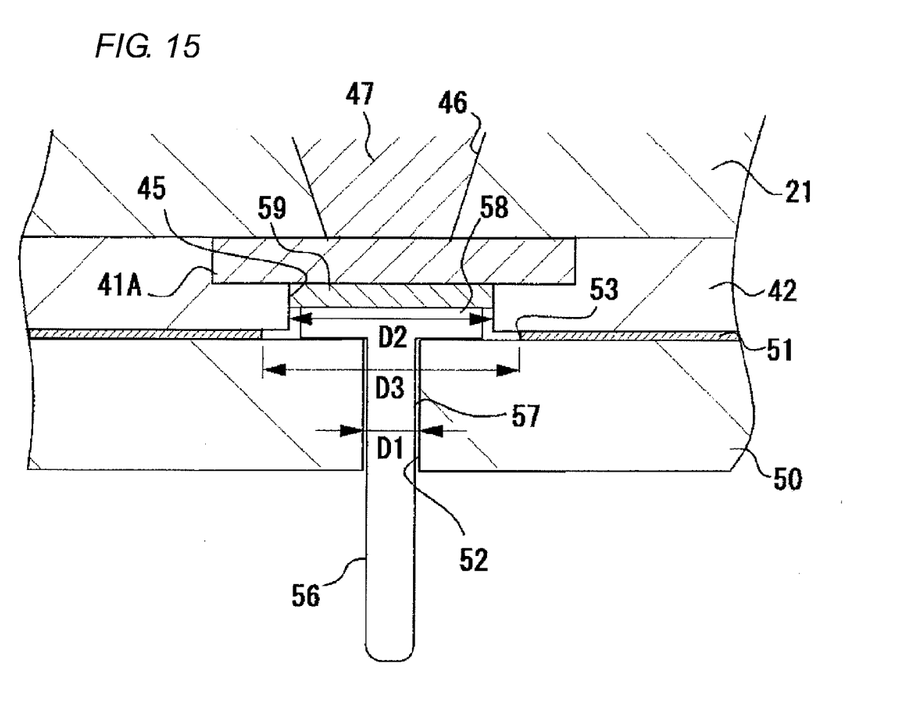
FIG. 15 is an enlarged cross-sectional view illustrating a main part of the coreless wiring board according to the exemplary another embodiment.

Specifically, as shown in FIG. 15, the terminal pin 56 has a nailhead shape including a shaft portion 57 and a head portion 58 having a diameter that is larger than that of the shaft portion 57. The head portion 58 is connected to the PGA pad 41A with a soldering portion 59 interposed therebetween. In addition, the shaft portion 57 of the terminal pin 56 passes through the opening 52 of the reinforcing plate 50 and the leading end thereof protrudes from the lower surface of the reinforcing plate 50. The reinforcing plate 50 is fixed to the solder resist 42 in a surface contact state by the adhesive layer 51. In the coreless wiring board 10A, the diameter D1 of the opening 52 of the reinforcing plate 50 and the diameter D2 of the opening 45 of the solder resist 42 are set to be smaller than the diameter D3 of the opening 53 of the adhesive layer 51. Therefore, it is possible to firmly fix the reinforcing plate 50 without the adhesive layer 51 protruding toward the inside of the opening 45 of the solder resist 42 or the inside of the opening 52 of the reinforcing plate 50. In addition, the diameter D1 of the opening 52 of the reinforcing plate 50 is set to be smaller than the diameter D2 of the opening 45 of the solder resist 42. Therefore, since the diameter D1 of the opening 52 of the reinforcing plate 50 is reduced, it is possible to ensure the rigidity of the reinforcing plate 50 and a sufficient reinforcement area by the reinforcing plate 50.

In the above-described embodiment, after the solder bumps 55 are formed on the BGA pads 41, a reinforcing plate adhering process and a hardening process are performed to fix the reinforcing plate 50 to the coreless wiring board 10. However, inversely, after the reinforcing plate 50 is fixed, the solder bumps 55 may be formed on the BGA pads 41.

In the coreless wiring boards 10 and 10A according to the above-described embodiments, the reinforcing plate 50 is formed of a glass epoxy substrate, but exemplary embodiments of the present invention are not limited thereto. Specifically, for example, a small amount of metal powder (for example, copper filler) capable of maintaining an insulating property may be mixed with a synthetic resin material to form the reinforcing plate 50. In this case, it is possible to improve the heat dissipation performance of the reinforcing plate 50.

While the present invention has been shown and described with reference to certain example embodiments, other implementations are within the scope of the claims. It will be understood by those skilled in the art that various changes in form and details may be made therein without departing from the spirit and scope of the invention as defined by the appended claims.

What is claimed is:

1. A multi-layer wiring board without a core substrate, comprising:
    a multi-layer laminated structure which is formed by alternately laminating a plurality of wiring layers and a plurality of insulating layers;
    a plurality of first terminals which are provided on a front surface of the multi-layer laminated structure and on which a semiconductor integrated circuit device is to be mounted;
    a plurality of second terminals which are provided on a rear surface of the multi-layer laminated structure opposite to the front surface and which are to be electrically connected to another board;
    a solder resist which is formed to cover the rear surface and which comprises a plurality of solder resist openings formed at positions corresponding to positions of the second terminals;
    a reinforcing plate which is made of a non-metal material and which comprises a plurality of reinforcing plate openings formed at positions corresponding to the positions of the second terminals; and
    an adhesive layer which is interposed between the solder resist and the reinforcing plate to fix the reinforcing plate to the solder resist in a surface contact state and which comprises a plurality of adhesive layer openings formed at positions corresponding to the position of the second terminals,
    wherein a diameter of the solder resist openings and a diameter of the reinforcing plate openings are smaller than that of the adhesive layer openings.

2. The multi-layer wiring board according to claim 1, wherein the diameter of the reinforcing plate openings is smaller than that of the solder resist openings.

3. The multi-layer wiring board according to claim 1, wherein the reinforcing plate is mainly formed of a synthetic resin, and the adhesive layer is formed of a hardened material of a thermosetting resin.

4. The multi-layer wiring board according to claim 1, wherein solder bumps or terminal pins are provided on a corresponding one of the second terminals.

5. The multi-layer wiring board according to claim 1, wherein the diameter of the solder resist openings is smaller than that of the adhesive layer openings by 50 μm or more.

6. The multi-layer wiring board according to claim 1, wherein the diameter of the reinforcing plate openings is reduced from a non-adhered surface to an adhered surface of the reinforcing plate.

7. A method of manufacturing a multi-layer wiring board, the method comprising:
    (a) providing a multi-layer laminated structure which is formed by alternately laminating a plurality of wiring layers and a plurality of insulating layers, wherein a plurality of first terminals are provided on a front surface of the multi-layer laminated structure, and a plurality of second terminals are provided on a rear surface of the multi-layer laminated structure opposite to the front surface;
    (b) forming a solder resist to cover the rear surface of the multi-layer laminated structure;
    (c) forming a plurality of solder resist openings in the solder resist such that the solder resist openings are formed at positions corresponding to positions of the second terminals;
    (d) providing a reinforcing plate which is made of a non-metal material and has a plurality of reinforcing plate openings formed therein, wherein an adhesive layer in non-hardened state is provided on one surface of the reinforcing plate, and the adhesive layer has a plurality of adhesive layer openings formed at positions corresponding to the positions of the reinforcing plate openings, and wherein a diameter of the solder resist openings and a diameter of the reinforcing plate openings are set to be smaller than that of the adhesive layer openings;
    (e) fixing the reinforcing plate to the solder resist in a surface contact state using the adhesive layer, such that each of the reinforcing plate openings is opposed to a corresponding one of the solder resist openings; and
    (f) hardening the adhesive layer in the non-hardened state at a temperature that is lower than a solder melting temperature.

* * * * *